United States Patent [19]

Lin et al.

[11] Patent Number: 5,560,813
[45] Date of Patent: Oct. 1, 1996

[54] SOLDER ELECTROPLATING SOLUTION CONTAINING GELATIN

[75] Inventors: Kwan-Lung Lin; Jieh-Ting Chang, both of Tainan, Taiwan

[73] Assignee: National Science Council, Taipei, Taiwan

[21] Appl. No.: 303,396

[22] Filed: Sep. 9, 1994

[51] Int. Cl.$^6$ ..................................... C25D 3/60
[52] U.S. Cl. .......................................... 205/253
[58] Field of Search ..................... 205/187, 213, 205/216, 219, 253, 299, 302; 106/128, 125

[56] References Cited

U.S. PATENT DOCUMENTS 3,785,939  1/1974  Hsu ............................ 205/253
4,270,986  6/1981  Smith ......................... 205/219

FOREIGN PATENT DOCUMENTS

86628   3/1983  Romania .
633938  11/1978  U.S.S.R. .

Primary Examiner—John Niebling
Assistant Examiner—Edna Wong
Attorney, Agent, or Firm—Hitt Chwang & Gaines

[57] ABSTRACT

The present invention relates to a fluoroborate solder electroplating solution containing lead (Pb) and tin (Sn) ions, in which the total Pb and Sn ion content is 35.5 to 150 g/l, and 70 wt % of them is Sn. The fluoroborate solder electroplating solution further contains 0.05–5 g gelatin per liter of the solder electroplating solution as an additive for increasing the deposition of Sn ions and enhancing the microstructural fineness of the solder plating. A suitable current density is 1 to 3 A/dm$^2$ in electroplating the present solder electroplating solution.

1 Claim, 10 Drawing Sheets

SOLDER ELECTROPLATING SOLUTION CONTAINING GELATIN

FIELD OF THE INVENTION

The present invention relates to a solder electroplating solution containing lead (Pb) and tin (Sn), in particular to a fluoroborate solder electroplating solution containing Pb and Sn.

BACKGROUND OF THE INVENTION

Generally speaking, solder (a lead-tin alloy or a tin-containing alloy) has a low melting point and is soft. The solder has a certain degree of corrosion and wear resistance and is often applied for soldering joints of electronic components and printed circuit boards. In the fabrication processes of electronic components or printed circuit boards, the solder bumps can be formed by physical vapor deposition, wave soldering and electroplating, etc. The electroplating technology has been widely used and research on this subject has been started early and the research is still developing.

The most commonly used solder electroplating solution is a fluoroborate electroplating bath. A typical fluoroborate solder electroplating solution contains about 465 g/l of zinc fluoroborate, about 67 g/l of tin fluoroborate, about 25 g/l of fluoroborate, about 40 g/l of boric acid and other suitable additives. The solution uses $Pb(BF_4)_2$ and $Sn(BF_4)_2$ as the source of Pb and Sn, respectively. $HBF_4$ increases the throwing power and stabilizes the solution. $H_3BO_3$ inhibits the decomposition of chloroborate. Other additives increase the smoothness and gloss of solder plating, electroplating rate, crystal refining, etc. Interfacial agents, such as betaines, ethylene oxide polymers, quaternary ammonium compounds, amines, amides, alkyl sulfonates, non-ionic amines, cationic amines, and aldehydes, have been developed as an additive that can effectively control the growth of solder plating. However, these interfacial agents are not used to control the relative content of Pb/Sn in the solder plating. Other solder electroplating bathes, besides fluoroborate, include: sulfonic acid bath—wherein acetaldehyde or phenolsulfonic acid is used as the gloss agent; sulfite bath (containing benzaldehyde, carboxylic acid, amide, esters, etc.); aromatic sulfonate bath and pyrophosphate bath, etc.

There are many ways to control the alloy composition of solder plating in the solder electroplating process. The Pb/Sn concentration ratio in the electrolyte is the dominant factor influencing the alloy composition of solder plating. As the content of bi-valence tin increases, the tin content in the solder plating will increase as well. However, in the method of using Pb-Sn concentration to control the solder plating composition, the deposition percentage of metals in the electroplating solution is not high. As a result, the production efficiency is not high and the process is not economical. This is one of the problems that the invention intends to solve.

Generally speaking, the current density will increase the tin content in the solder plating while some additives might also influence the tin content in the solder plating. The composition of the anode used in electroplating is one of the factors affecting the tin content. Common solders used in the electronic industry include 63Sn-37Pb, 95Pb-5Sn, 99Pb-1Sn; wherein 63Sn-37Pb is easier to form solder plating through electroplating process and is commonly used. The melting point of 63Sn- 37Pb is the lowest among the solders mentioned. By controlling the above variables, a solder plating with desired alloy composition might be achieved; however, the deposition percentage of Sn is not easy to be increased. As a result, the current efficiency is adversely affected and the electrolyte is not used efficiently.

When the solder electroplating technique is used in the fabrication of electronic components and devices, the mechanical and electrical properties of the solder plating must be taken into consideration. These properties are closely related to the microstructure of solder plating. A. Brenner, in *Electrodeposition of Alloys,* Academic Press, London, Vol. 1 and Vol. 2, states that when the tin content in the solder plating is about 37 wt %, the grain size of solder plating microstructure is the smallest. Theoretically, a well control of electroplating current may lead to a fine microstructure of solder plating—i.e., a fine surface crystal size. The crystal size of solder plating directly influences its mechanical properties. When the crystal size is relatively small, the strength of the solder plating is relatively high. Therefore, the control of crystal size through simple means is very important to industrial applications. The main purpose of the invention is to provide an improved fluoroborate electroplating solution, thereby one can effectively control the tin content of solder plating and increase the deposition of Sn ions as well as enhance the microstructural fineness of solder plating.

SUMMARY OF THE INVENTION

The present invention relates to a solder electroplating solution containing gelatin. Particularly, the present invention relates to a fluoroborate electroplating solution containing Sn and Pb, in which gelatin is added so as to increase the deposition of Sn ions and enhance the microstructural fineness of solder plating. The total concentration of Pb and Sn ions in the solder electroplating solution is 35.5 g/l to 150 g/l, wherein the Sn ions are 5 wt % to 70 wt % of the total metal ions. When the addition of gelatin is within 0.05–5 g/l, the gelatin can enhance the microstructural fineness of the solder plating and meanwhile enable the deposition of tin ions in the electroplating solution to be over 90%. The applicable electroplating current density is 1 to 3 $A/dm^2$.

BRIEF DESCRIPTION OF THE DRAWINGS

the addition of gelatin is 0.5 g/l in FIG. 7(b) (62 wt % of Sn in the solder plating).

the addition of gelatin is 1.5 g/l in FIG. 7(c) (69.9 wt % of Sn in the solder plating).

the addition of gelatin is 5 g/l in FIG. 7(d) (71.2 wt % of Sn in the solder plating).

the addition of gelatin is 0.5 g/l in FIG. 8(b) (7.5 wt % of Sn in the solder plating).

the addition of gelatin is 1.5 g/l in FIG. 8(c) (8.2 wt % of Sn in the solder plating).

the addition of gelatin is 5 g/l in FIG. 8(d) (9.7 wt % of Sn in the solder plating).

DETAILED DESCRIPTION OF THE INVENTION

Figure 1:
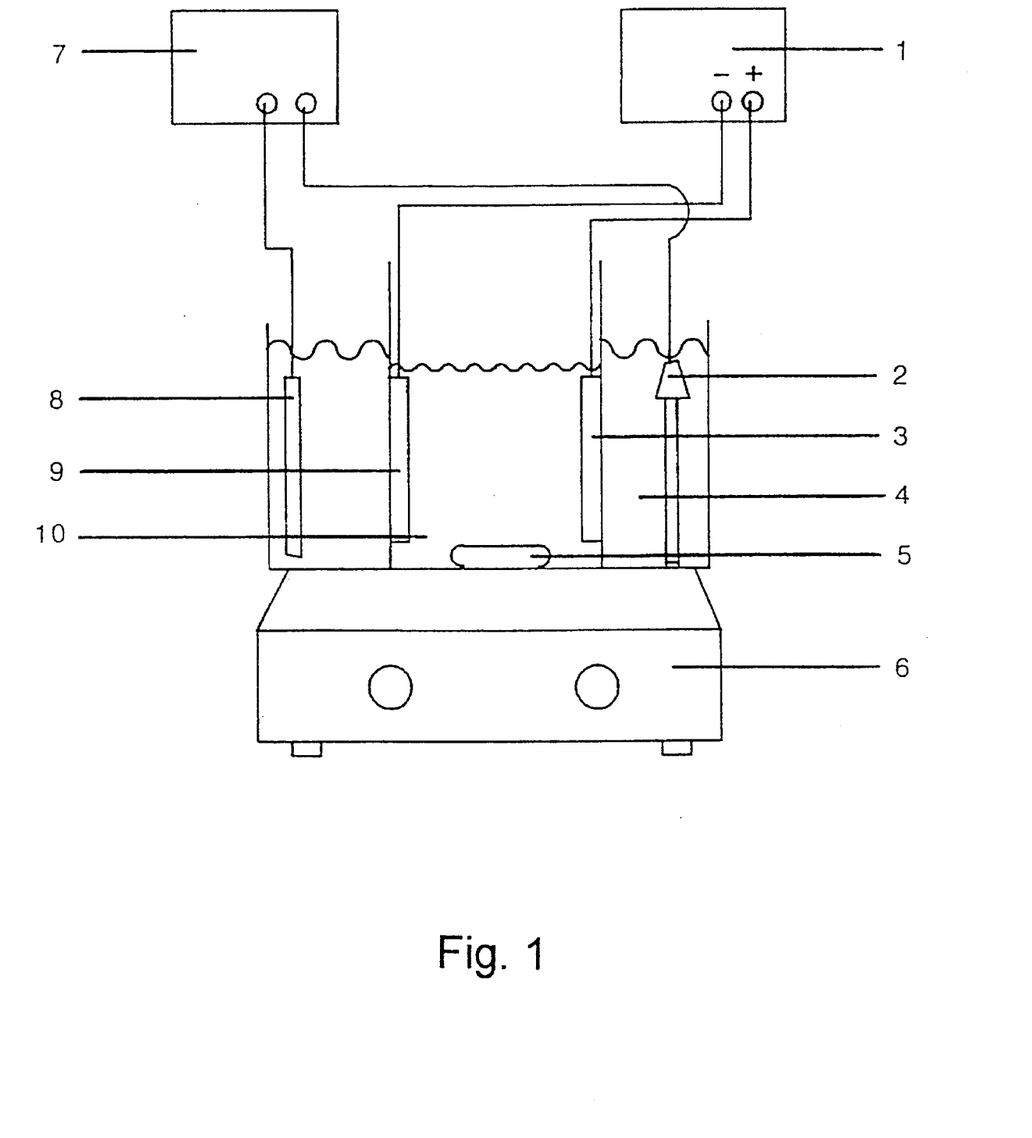
FIG. 1 is a schematic drawing of the solder electroplating apparatus used in the present invention, wherein 1 is a power supply, 2 is a thermocouple, 3 is a graphite plate, 4 is a constant temperature water bath, 5 is a magnetic stirring bar, 6 is an electromagnetic stirrer, 7 is a temperature controller, 8 is a heater, 9 is a specimen to be electroplated, and 10 is an solder electroplating solution.

The electroplating apparatus used in the invention is shown in FIG. 1. The apparatus uses a constant potentiometer as the power supply 1. The electroplating solution 10 is stirred by an electromagnetic stirrer 6 with a magnetic stirring bar 5 and its temperature is controlled by water bath 4. The anode 3 is a 6×6.5×0.5 high density graphite plate. The electroplating solution has a volume of 500 ml. The cathode 3 is a 3×4×0.04 aluminum plate coated with electroless nickel. The thickness of the electroless nickel is about 3 μm. Before solder electroplating, the aluminum plate coated with electroless nickel is subjected to an alkaline electro-cleaning, wherein said aluminum plate coated with electroless nickel is immersed in an alkaline electro-cleaning aqueous solution in an electrolysis cell as an anode and cleaned by electric current. The alkaline electro-cleaning aqueous solution contains 55 g/l of NaOH, 18 g/l of $Na_2CO_3$, 10 g/l of $Na_2SiO_3$, 6 g/l of $Na_3PO_4$ and 1 g/l of $Na_2(CHCOO)_2$. The current density is 5 A/dm$^2$. The electro-cleaning time is 30 seconds. The treated aluminum plate is removed from the electrolysis cell, washed with water, an acidic aqueous solution containing 10 vol % of HCl for 15 seconds and water in sequence. The aluminum plate is now ready for solder electroplating. Examples and performances of the invented electroplating process are shown as follows.

EXAMPLE 1

The total Pb and Sn ion concentration in the solder electroplating solution is 35.5 g/l to 150 g/l wherein the Sn ion is 5 wt % to 70 wt % of the total metal ions. The solution uses $Pb(BF_4)_2$ and $Sn(BF_4)_2$ as the source of Pb and Sn, respectively, and contains 100 g/l of $HBF_4$ and 25 g/l of $H_3BO_3$. The current density is 1 to 3 A/dm$^2$. In order to control the composition of solder plating and enhance microstructural fineness of solder plating, the invention uses gelatin as an additive. The amount of addition of gelatin is 0.05 to 5 g/l. The temperature of electroplating solution is 20° to 30° C. The ratio of electroplating current versus electroplating solution volume remains at 288 Coulomb/l.

Figure 2:
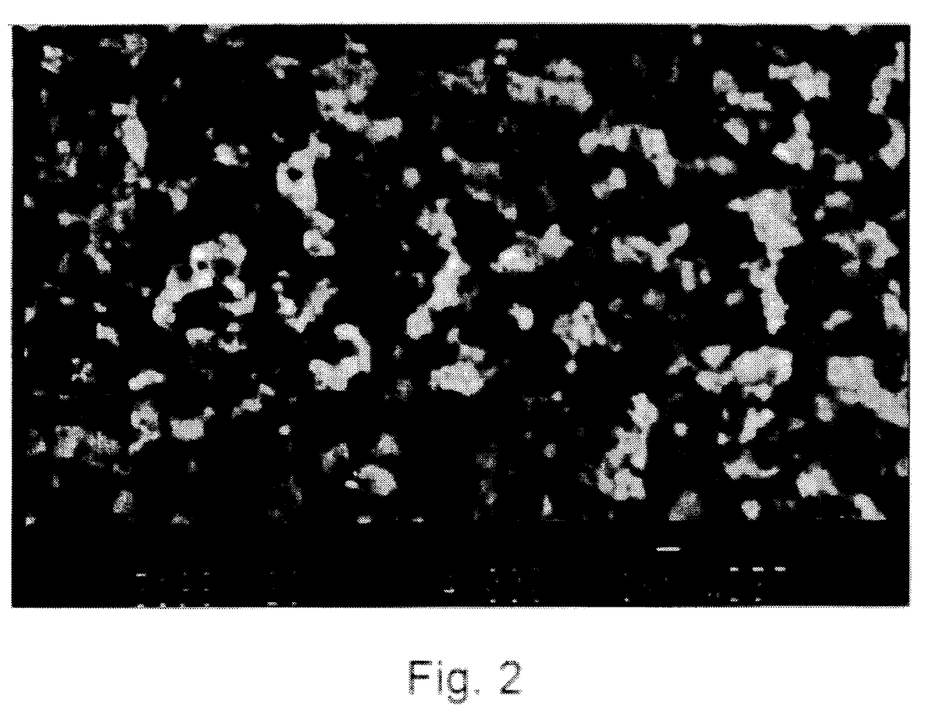
FIG. 2 is a Back Scattered Electron Image (BEI) of the solder plating formed by the solder electroplating solution containing 70 wt % of Sn based on the weight of the total metal ions.

FIG. 2 is a Back Scattered Electron Image (BEI) of the solder plating formed by the solder electroplating solution containing 70 wt % of Sn ions based on the total metal ions and no gelatin. The dark color part is the Sn metal. The figure shows that the electroplating conditions of this example can obtain Pb-Sn solder plating.

EXAMPLE 2

Figure 3:
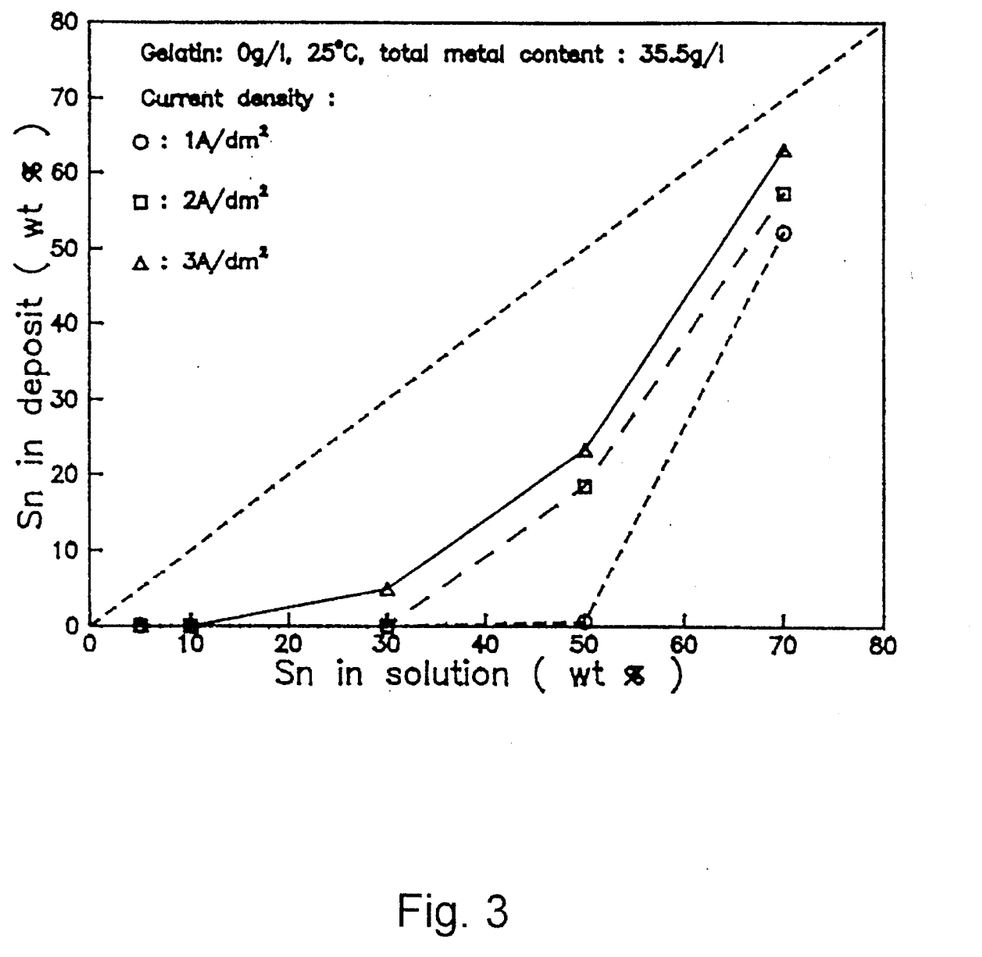
FIG. 3 is a plot which shows the effect of current density on the Sn content in the solder plating for the solder electroplating solutions having different Sn ion concentrations and no gelatin, wherein curve—○—represents represents current density of 1 $A/dm^2$, curve—□—represents current density of 2 $A/dm^2$, and curve—△—represents current density of 3 $A/dm^2$.

The electroplating conditions used in this example are within the ranges stated in Example 1. The total ion concentration in the solder electroplating solution is 35.5 g/l and no gelatin is added. The current density is 1 to 3 A/dm$^2$. Sn ions are 5 wt % to 70 wt % of the total metal ions. The Sn content of solder plating at the electroplating condition is shown in FIG. 3. The deposition of Sn ions in the electroplating solution is proportional to the current density; however, the deposition percentage of Sn ions is not high. FIG. 3 can be used as a control for the performances of the following examples.

EXAMPLE 3

Figure 4:
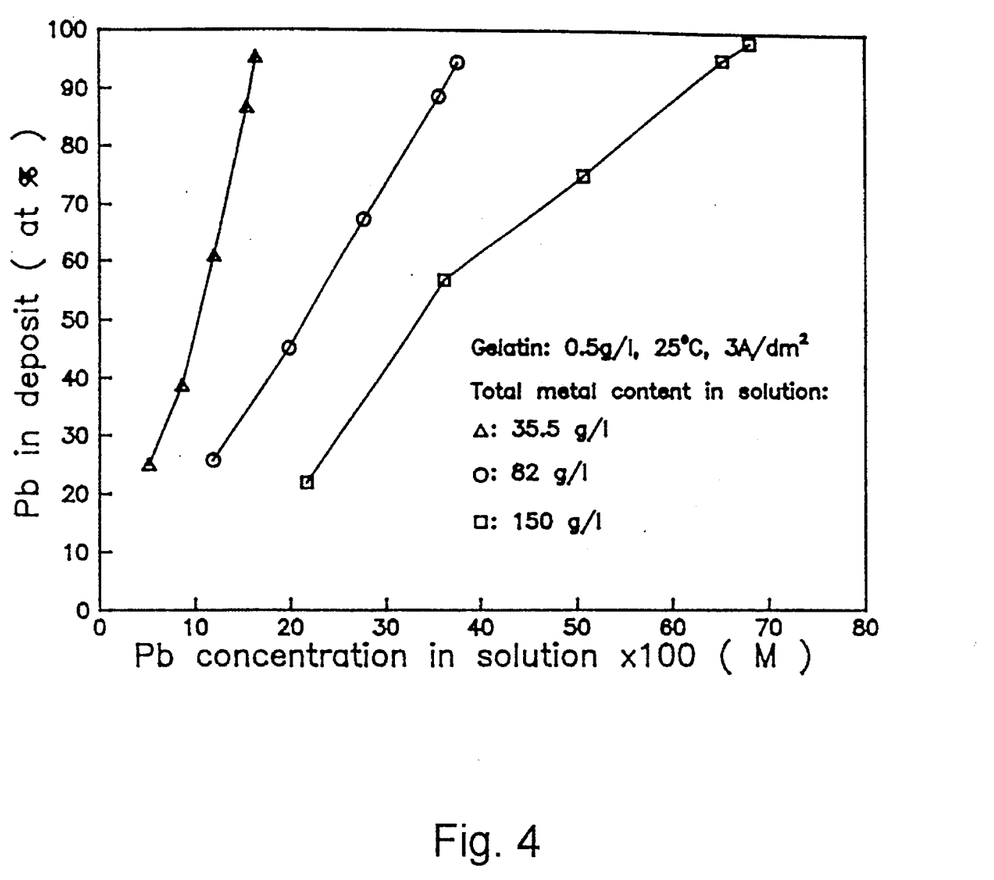
FIG. 4 is a plot which shows the relationship between the Pb ion concentration of the solder electroplating solution and the Pb content in the solder plating for the solder electroplating solutions having different total metal ion contents, wherein curve—△—represents the total metal ion content of 35.5 g/l, curve—○—represents the total metal ion content of 82 g/l, and curve—□—represents the total metal ion content of 150 g/l.

The electroplating conditions of this example are within the ranges stated in Example 1. The total metal ion concentration in the solder electroplating solution is 35.5 g/l to 150 g/l and the amount of gelatin addition is 0.5 g/l. The current density is 3 A/dm$^2$. Temperature of the electroplating solution is 25° C. The Pb ion concentration in the electroplating solution is 0.05 to 0.7M (mole concentration). The performances of this example are shown in FIG. 4. It can be seen from FIG. 4 that the Pb content of solder plating is at 20 at % to 98 at % (at %: atomic %). As the concentrations of different metal ions and/or the total metal ions in the solution change, the Pb content of solder plating changes as well. Approximately, there is a trend that the Pb content of solder plating increases when the Pb ion concentration and the total metal ions content in the electroplating solution increase.

EXAMPLE 4

Figure 5:
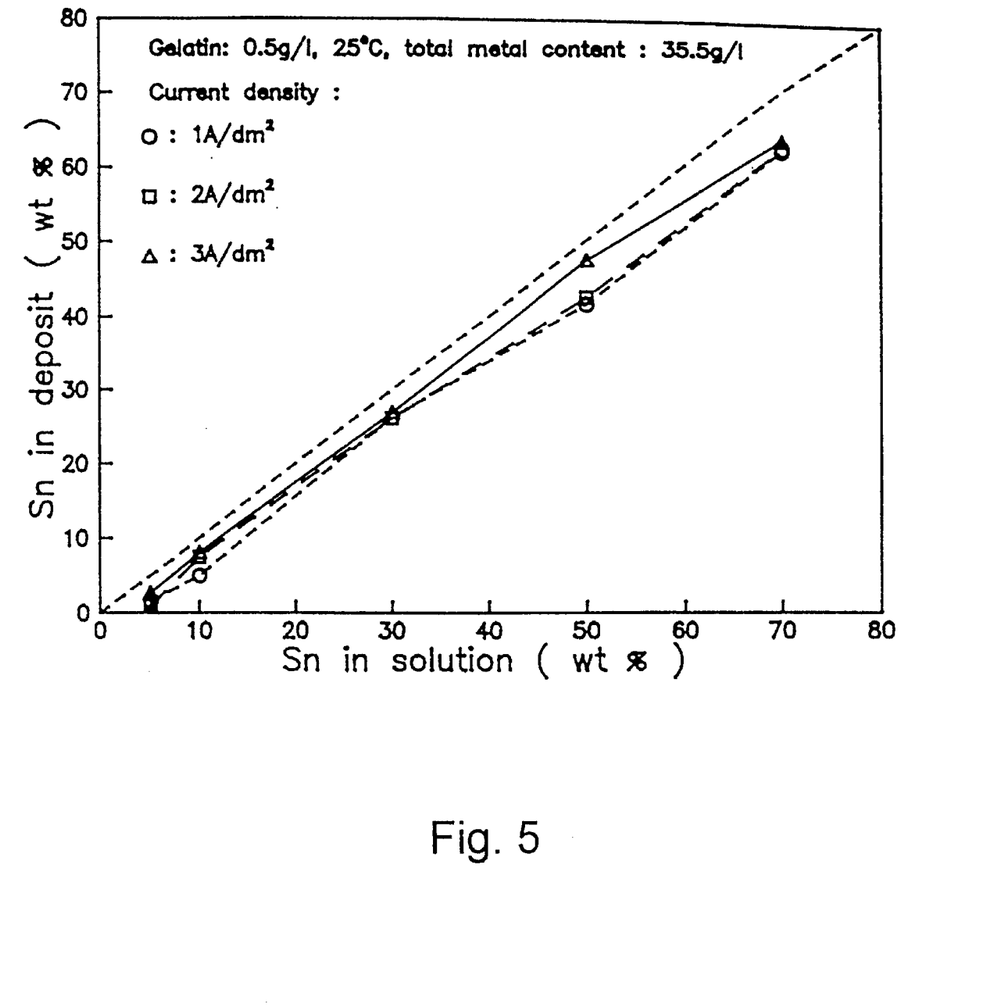
FIG. 5 is a plot which shows the effect of current density on the Sn content in the solder plating for the solder electroplating solutions having different Sn ion concentrations and 0.5 g/l gelatin, wherein curve—○—represents current density of 1 A/dm$^2$, curve—□—represents current density of 2 A/dm$^2$, and curve—△—represents current density of 3 A/dm$^2$.

The electroplating conditions of Example 2 were repeated in this example, except that 0.5 g/l of gelatin instead of no gelatin was added to the solder electroplating solution. The performances of this example are shown in FIG. 5. Compared to FIG. 3, the Sn content of solder plating in this example increases significantly. It can be clearly seen form FIG. 5 that the Sn content of solder plating increases almost linearly with the increase of weight percent of Sn ions based on the total metal ions in the solder electroplating solution, and the slopes of the current densities of 1, 2 and 3 A/dm$^2$ curves are all close to 1. The deposition percentage of Sn ions is close to 90%.

EXAMPLE 5

Figure 6:
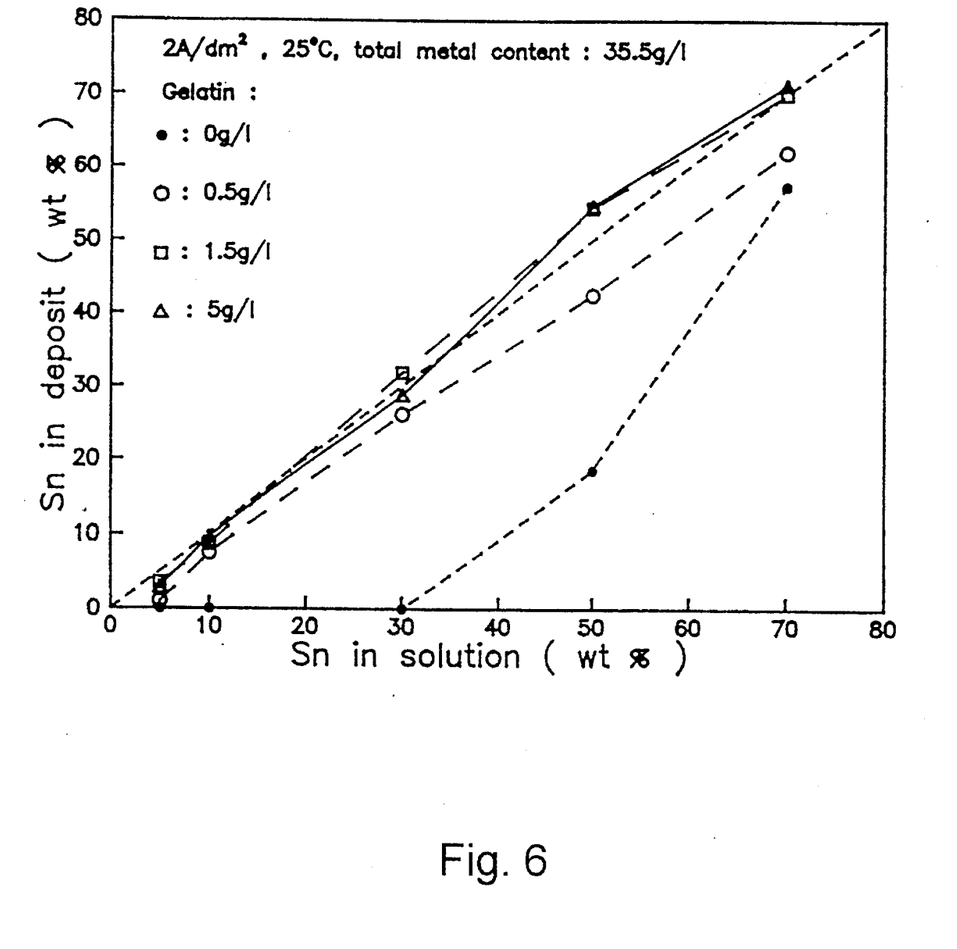
FIG. 6 is a plot which shows the effect of the amount of gelatin addition on the Sn content in the solder plating for the solder electroplating solutions having different Sn ion concentrations, wherein curve—●—represents the amount of gelatin addition of 0 g/l, curve—○—represents the amount of gelatin addition of 0.5 g/l, curve—□—represents the amount of gelatin addition of 1.5 g/l, and curve—△—represents the amount of gelatin addition of 5 g/l.
Figure 7A:
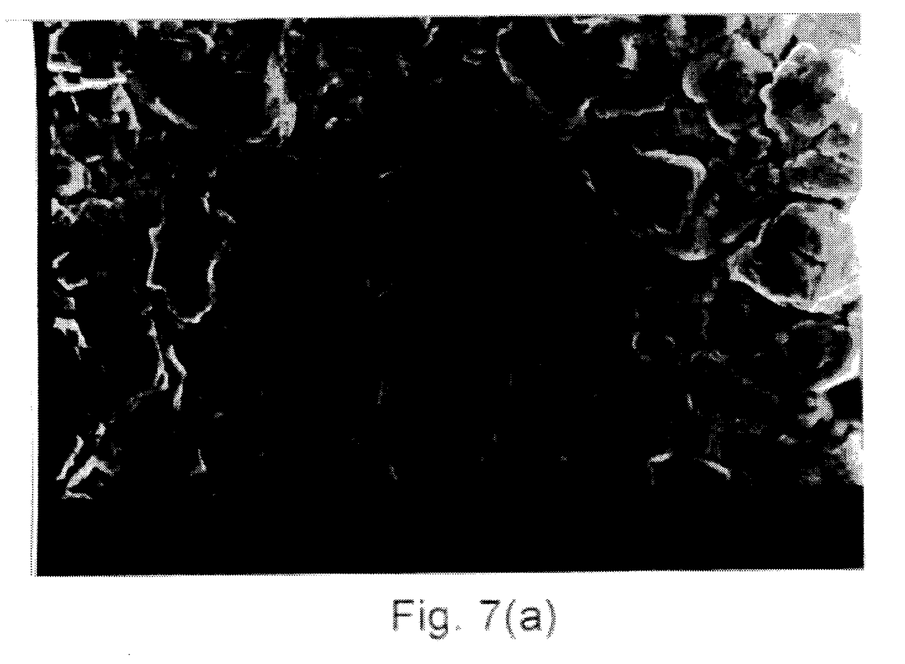
FIGS. 7(a) to 7(d) are Back Scattered Electron Images (BEI's) which show the effect of the amount of gelatin addition on the surface microstructure of solder plating wherein the total metal ion content in the electroplating solution is 35.5 g/l, Sn ions are 70 wt % based on the total metal ions, the electroplating temperature is 25° C., the electroplating current density is 2 A/dm$^2$, the addition of gelatin is 0 g/l in FIG. 7(a) (51 wt % of Sn in the solder plating)
Figure 7B:
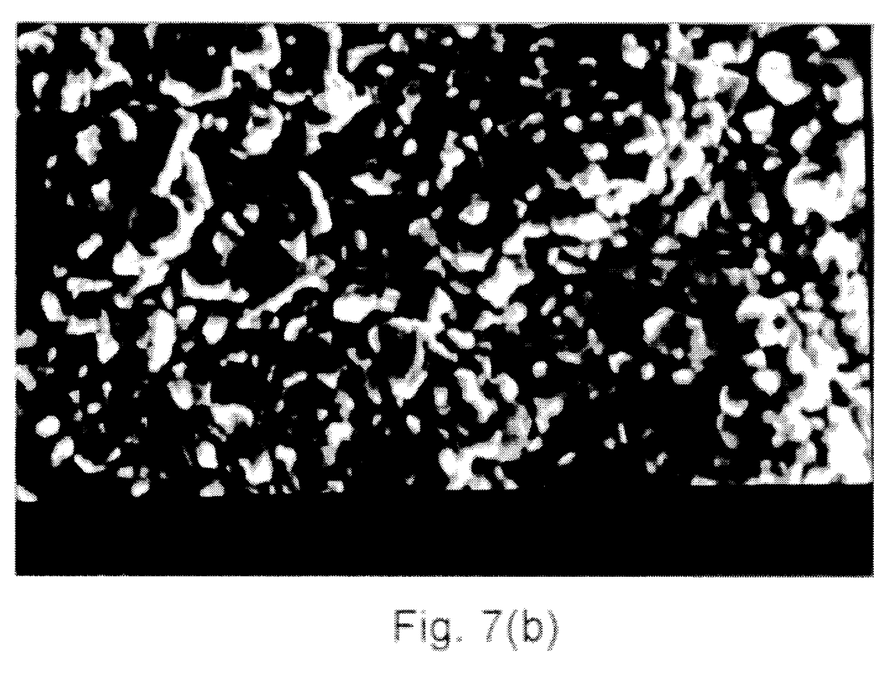
Figure 7C:
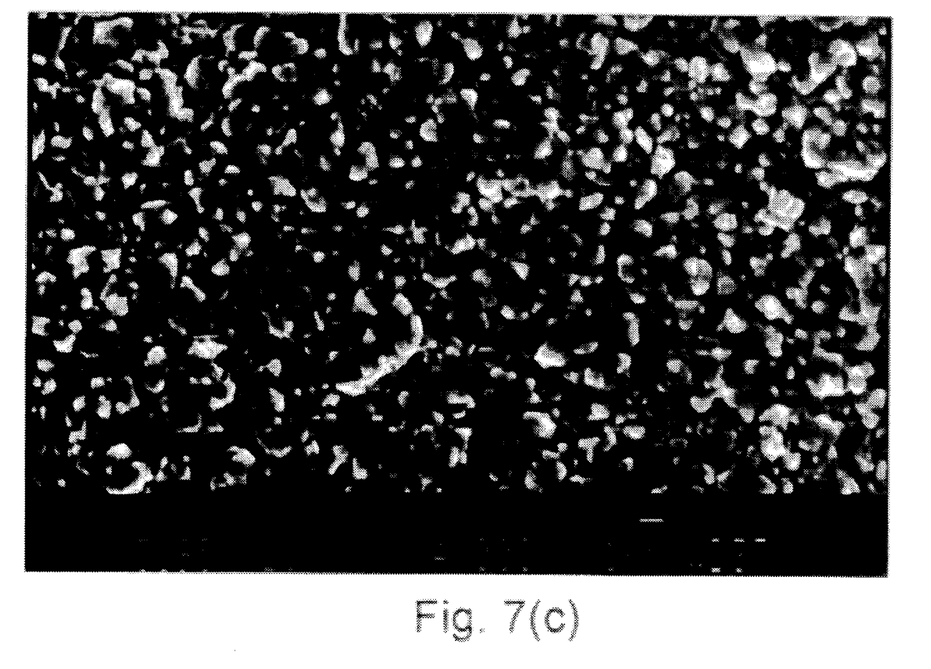
Figure 7D:
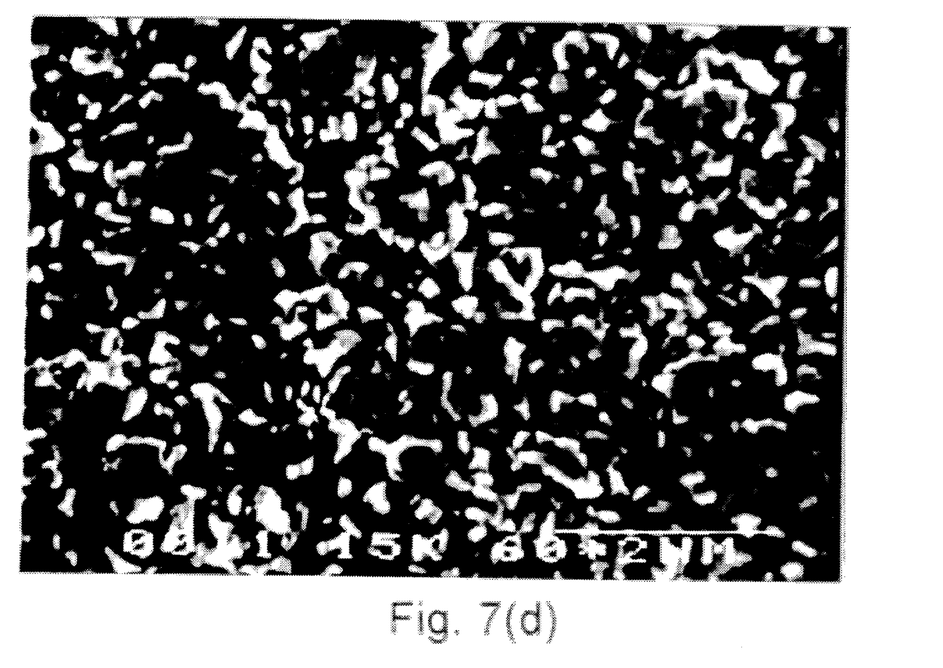
Figure 8A:
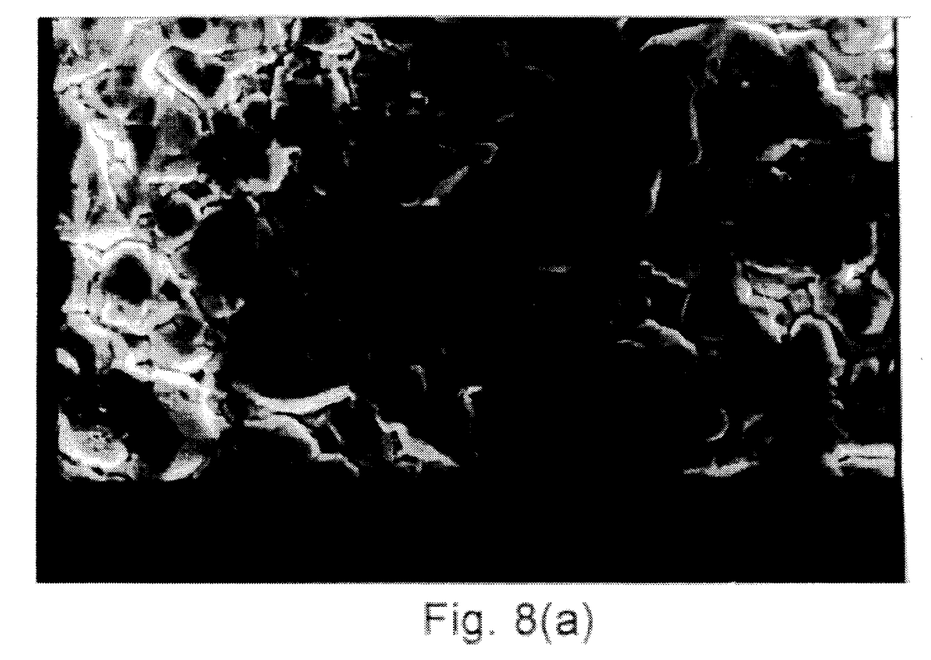
FIGS. 8(a) to 8(d) are Back Scattered Electron Images (BEI's') which show the effect of the amount of gelatin addition on the microstructure of solder plating surface wherein the total metal ion content in the electroplating solution is 35.5 g/l, Sn ions are 10 wt % based on the total metal ions, the electroplating temperature is 25° C., the electroplating current density is 2 A/dm$^2$, the addition of gelatin is 0 g/l in FIG. 8(a) (no Sn in the solder plating)
Figure 8B:
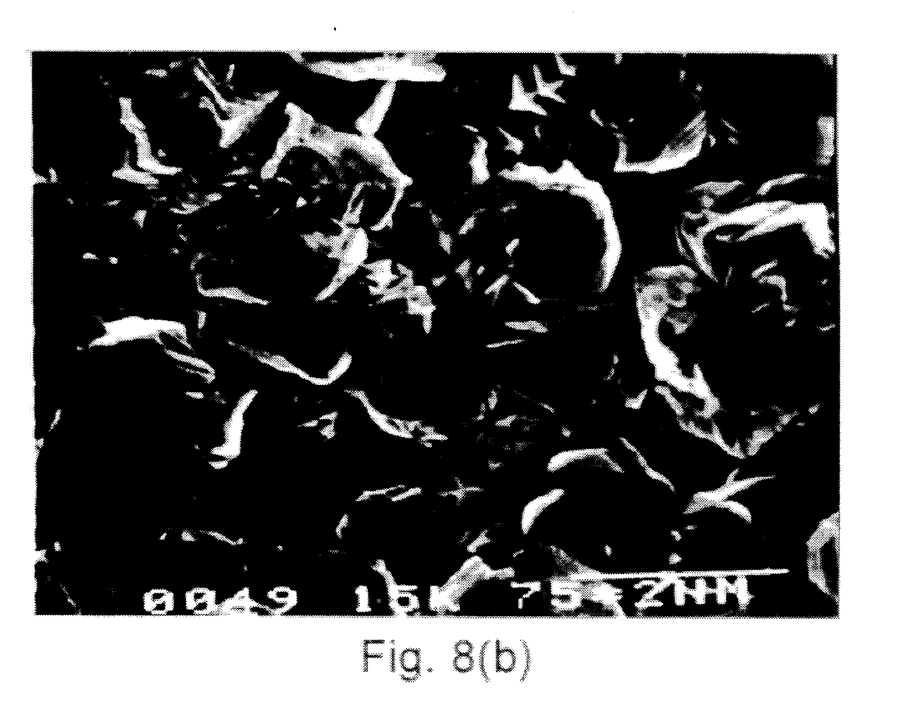
Figure 8C:
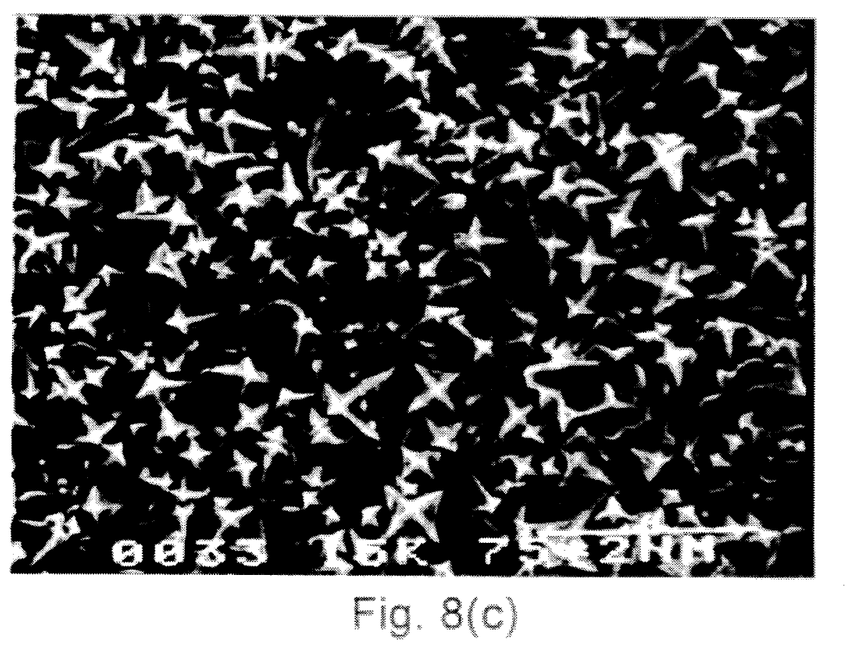
Figure 8D:
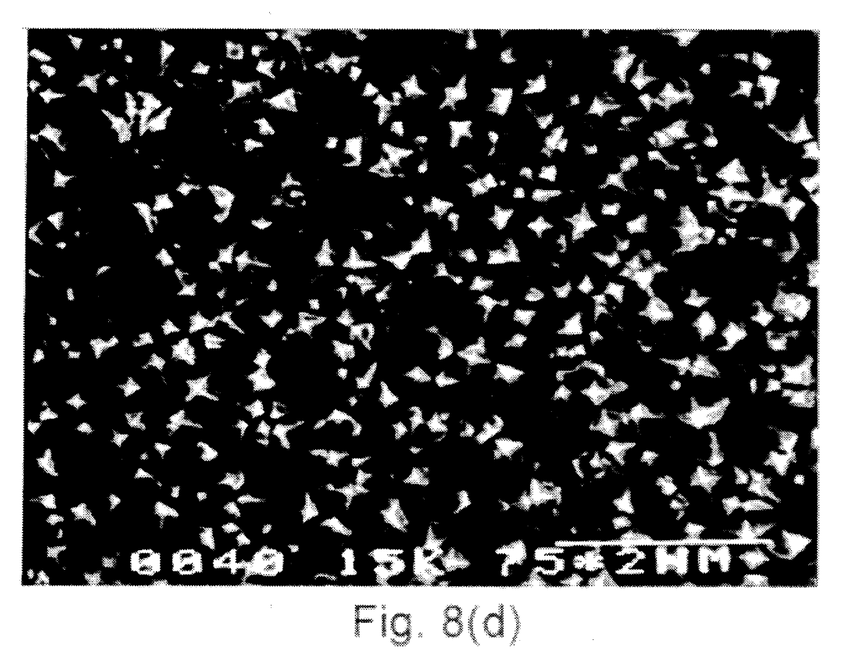

The electroplating conditions of this example were similar to those of Example 2, except that the current density was fixed at 2 A/dm$^2$ and 0 to 5 g/l of gelatin were added to the solder electroplating solutions. The performances of this example are shown in FIG. 6. The curves in FIG. 6 indicate that gelatin promotes the deposition of Sn ions, and the weight percent of Sn in the solder plating is approximately equal to the weight percent of Sn ions based on the total metal ions in the solder electroplating solution when gelatin is added.

EXAMPLE 6

The solder electroplating solutions used in this example contain 35.5 g/l total metal ions and 0 to 5 g/l of gelatin. Sn ions is 70% based on the weight of total metal ions. The current density is 2 A/dm$^2$. Temperature of the electroplating solution is 25° C. The performances of this example are shown by the Back Scattered Electron Images (BEI's) of the solder platings. FIG. 7(*a*) is a BEI of a solder plating formed with a solder electroplating solution having no gelatin. FIGS. 7(*b*) to 7(*d*) are BEI's of solder platings formed with solder electroplating solution having 0.5, 1.5 and 5 g/l gelatin, respectively. It can been clearly seen from FIGS. 7(*a*)–7(*d*) that gelatin improves the microstructural fineness of solder plating.

EXAMPLE 7

The electroplating conditions of Example 6 were repeated in this example, except that the weight percent of Sn ions based on the total metal ions in the solder electroplating solution is 10% instead of 70%. The performances of this example are shown in the Back Scattered Electron Images (BEI's) of FIGS. 8(*a*) to 8(*d*). FIG. 8(*a*) is a BEI of a solder plating formed with a solder electroplating solution having no gelatin. FIGS. 8(*b*) to 8(*d*) are BEI's of solder platings formed with solder electroplating solution having 0.5, 1.5 and 5 g/l gelatin, respectively. It can been clearly seen from FIGS. 8(*a*)–8(*d*) that gelatin enhances the microstructural fineness of solder plating.

STATEMENT OF INDUSTRIAL APPLICATION

The present invention provides a solder electroplating solution containing lead and tin which can be used in forming solder bump electrical joints between electrical components by electroplating.

What is claimed is:

1. A fluoroborate solder electroplating solution consisting essentially of 35.5 g/l to 150 g/l of Sn and Pb ions as a whole in which the Sn ions is 5 wt % to 70 wt % of the total Sn and Pb ions, 100 g/l of $HBF_4$, 25 g/l of $H_3BO_3$, 0.05 to 5 g/l of gelatin, in which the Sn ions is $Sn(BF_4)_2$ and the Pb ions is $Pb(BF_4)_2$.

* * * * *

UNITED STATES PATENT AND TRADEMARK OFFICE
CERTIFICATE OF CORRECTION

PATENT NO. : 5,560,813
DATED : October 1, 1996
INVENTOR(S) : Lin et al.

It is certified that error appears in the above-indentified patent and that said Letters Patent is hereby corrected as shown below:

On the cover page, in the Inventors, change "Kwan-Lung Lin" to -- Kwang-Lung Lin --.

Col. 2, line 60, delete "represents".

Col. 6, line 33, change "which the Sn ions" to -- which the source of Sn ions --.

Col. 6, line 33, change "and the Pb ions" to -- and the source of Pb ions --.

Signed and Sealed this

Fourteenth Day of January, 1997

Attest:

BRUCE LEHMAN

*Attesting Officer*  *Commissioner of Patents and Trademarks*